(12) United States Patent
Czornomaz et al.

(10) Patent No.: US 9,123,585 B1
(45) Date of Patent: Sep. 1, 2015

(54) METHOD TO FORM GROUP III-V AND SI/GE FINFET ON INSULATOR

(71) Applicant: International Business Machines Corporation, Armonk, NY (US)

(72) Inventors: Lukas Czornomaz, Zurich (CH); Jean Fompeyrine, Waedenswil (CH); Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/177,447

(22) Filed: Feb. 11, 2014

(51) Int. Cl.
*H01L 21/84* (2006.01)
*H01L 27/12* (2006.01)
*H01L 27/092* (2006.01)
*H01L 29/161* (2006.01)
*H01L 29/20* (2006.01)
*H01L 21/02* (2006.01)
H01L 29/78 (2006.01)
H01L 21/8238 (2006.01)

(52) U.S. Cl.
CPC ...... *H01L 27/1211* (2013.01); *H01L 21/02532* (2013.01); *H01L 21/02538* (2013.01); *H01L 21/845* (2013.01); *H01L 27/0922* (2013.01); *H01L 29/161* (2013.01); *H01L 29/20* (2013.01); *H01L 21/823821* (2013.01); *H01L 29/785* (2013.01)

(58) Field of Classification Search
CPC .............. H01L 29/785; H01L 27/1211; H01L 29/66795; H01L 21/823821; H01L 21/845
USPC ....................................................... 438/156
See application file for complete search history.

(56) References Cited

U.S. PATENT DOCUMENTS

| 6,835,618 | B1 | 12/2004 | Dakshina-Murthy et al. |
| 6,855,582 | B1 | 2/2005 | Dakshina-Murthy et al. |
| 7,291,886 | B2 | 11/2007 | Doris et al. |

(Continued)

FOREIGN PATENT DOCUMENTS

| CN | 103021815 A | 12/2012 |
| CN | 103021927 A | 4/2013 |
| WO | 2013152176 A1 | 10/2013 |

OTHER PUBLICATIONS

Dohrman, Carl Lawrence; "Substrate engineering for monolithic integration of III-V semiconductors with Si CMOS technology," 2008, Massachusetts Institute of Technology (MIT); (172 pages).

*Primary Examiner* — Steven J Fulk
(74) *Attorney, Agent, or Firm* — Harrington & Smith; Louis J. Percello

(57) ABSTRACT

A method includes providing a structure having a substrate, a first electrically insulating layer overlying the substrate, a first semiconductor layer comprised of a first semiconductor material overlying the first electrically insulating layer, a second electrically insulating layer overlying the first semiconductor layer in a first portion of the structure and a second semiconductor layer comprised of a second, different semiconductor material overlying the second electrically insulating layer in the first portion. The method further includes growing additional first semiconductor material on the first semiconductor layer in a second portion of the structure to form a regrown semiconductor layer; forming fins; forming gate structures orthogonal to the fins and removing at least a portion of the first semiconductor layer in the first portion of the structure to form a void and filling the void with insulating material. Structures formed by the method are also disclosed.

12 Claims, 10 Drawing Sheets

(56) References Cited

U.S. PATENT DOCUMENTS

| | | | |
|---|---|---|---|
| 7,485,506 B2 | 2/2009 | Doris et al. | |
| 7,754,560 B2 * | 7/2010 | Burnett et al. | 438/212 |
| 7,932,123 B2 | 4/2011 | Rogers et al. | |
| 8,120,060 B2 | 2/2012 | Fitzgerald | |
| 8,466,012 B1 * | 6/2013 | Chang et al. | 438/149 |
| 8,525,228 B2 | 9/2013 | Javey et al. | |
| 2004/0108559 A1 * | 6/2004 | Sugii et al. | 257/411 |
| 2004/0217434 A1 * | 11/2004 | Lee et al. | 257/412 |
| 2004/0227187 A1 * | 11/2004 | Cheng et al. | 257/347 |
| 2005/0118783 A1 * | 6/2005 | Oh et al. | 438/421 |
| 2005/0130358 A1 * | 6/2005 | Chidambarrao et al. | 438/197 |
| 2005/0224875 A1 * | 10/2005 | Anderson et al. | 257/347 |
| 2005/0239242 A1 * | 10/2005 | Zhu et al. | 438/199 |
| 2006/0049460 A1 * | 3/2006 | Chen et al. | 257/347 |
| 2006/0084212 A1 | 4/2006 | Anderson et al. | |
| 2006/0113603 A1 * | 6/2006 | Currie | 257/368 |
| 2006/0170045 A1 * | 8/2006 | Yan et al. | 257/347 |
| 2006/0292770 A1 * | 12/2006 | Wu et al. | 438/187 |
| 2007/0281446 A1 * | 12/2007 | Winstead et al. | 438/478 |
| 2008/0227241 A1 * | 9/2008 | Nakabayashi et al. | 438/150 |
| 2009/0057761 A1 | 3/2009 | Kim et al. | |
| 2009/0148986 A1 | 6/2009 | Cheng et al. | |
| 2009/0159972 A1 * | 6/2009 | Jakschik et al. | 257/350 |
| 2010/0151689 A1 | 6/2010 | Gmitter et al. | |
| 2010/0219509 A1 | 9/2010 | He et al. | |
| 2012/0061728 A1 | 3/2012 | Javey et al. | |
| 2013/0075818 A1 * | 3/2013 | Lee et al. | 257/347 |
| 2013/0175618 A1 * | 7/2013 | Cheng et al. | 257/347 |
| 2013/0320294 A1 * | 12/2013 | Cappellani et al. | 257/9 |
| 2013/0337637 A1 * | 12/2013 | Cheng et al. | 438/478 |
| 2014/0008730 A1 * | 1/2014 | Mitard et al. | 257/369 |
| 2014/0070322 A1 * | 3/2014 | Jacob et al. | 257/368 |
| 2014/0091392 A1 * | 4/2014 | Takada et al. | 257/351 |
| 2014/0217467 A1 * | 8/2014 | Pawlak et al. | 257/183 |
| 2014/0339643 A1 * | 11/2014 | Cheng et al. | 257/369 |
| 2015/0021699 A1 * | 1/2015 | Ando et al. | 257/368 |

* cited by examiner

US 9,123,585 B1

METHOD TO FORM GROUP III-V AND SI/GE FINFET ON INSULATOR

TECHNICAL FIELD

The exemplary embodiments of this invention relate generally to semiconductor devices and fabrication techniques and, more specifically, relate to the fabrication of semiconductor transistor devices known as FINFETs, such as those used in logic circuitry, using a semiconductor on insulator substrate, where the semiconductor in one area is comprised of a Group III-V compound material and in another area is comprised of, for example, a Silicon-Germanium (SiGe) compound material.

BACKGROUND

One approach to achieving sub-10 nm geometry devices would co-integrate Si/Ge with a Group III-V compound semiconductor material. The Group III-V material could be a binary material such, as for example, Gallium Arsenide (GaAs) or Gallium Antimonide (GaSb). The Group III-V material could also be a tertiary material such as, for example, Indium Gallium Arsenide (InGaAs) or Indium Gallium Antimonide (InGaSb).

Wafer bonding could be used to achieve the co-integration of the Si/Ge with the Group III-V material. However, bonding two such dissimilar materials on Silicon is difficult to perform in a reliable and repeatable manner

SUMMARY

In a first aspect of the embodiments of this invention a method is disclosed that comprises providing a structure comprised of a substrate, a first electrically insulating layer overlying a surface of the substrate, a first semiconductor layer comprised of a first semiconductor material overlying the first electrically insulating layer, a second electrically insulating layer overlying the first semiconductor layer in a first portion of the structure, and a second semiconductor layer comprised of a second semiconductor material different from the first semiconductor material overlying the second electrically insulating layer in the first portion. The method further includes growing additional first semiconductor material on the first semiconductor layer in a second portion of the structure to form a regrown semiconductor layer; forming fins in the regrown semiconductor layer and in the second semiconductor layer; forming gate structures orthogonal to the fins; removing at least a portion of the first semiconductor layer in the first portion of the structure between the first electrically insulating layer and the second electrically insulating layer to form a void and filling the void with an electrically insulating material.

In accordance with another aspect of the embodiments of this invention there is described a structure that includes a substrate, a first electrically insulating layer overlying a surface of the substrate, a first semiconductor layer comprised of a first semiconductor material overlying the first electrically insulating layer, a second electrically insulating layer overlying the first semiconductor layer in a first portion of the structure, and a second semiconductor layer comprised of a second semiconductor material different from the first semiconductor material overlying the second electrically insulating layer in the first portion. The structure also includes additional first semiconductor material on the first semiconductor layer in a second portion of the structure; a plurality of substantially parallel fins formed in the additional first semiconductor layer and in the second semiconductor layer; a plurality of substantially parallel gate structures disposed orthogonal to the plurality of fins; and a void disposed in the first portion of the structure between the first electrically insulating layer and the second electrically insulating layer.

In accordance with yet another aspect of the embodiments of this invention there is described a structure that includes a substrate, a first electrically insulating layer overlying a surface of the substrate, a first semiconductor layer comprised of a first semiconductor material overlying the first electrically insulating layer, a second electrically insulating layer overlying the first semiconductor layer in a first portion of the structure, and a second semiconductor layer comprised of a second semiconductor material different from the first semiconductor material overlying the second electrically insulating layer in the first portion. The structure also includes additional first semiconductor material on the first semiconductor layer in a second portion of the structure; a plurality of substantially parallel fins formed in the additional first semiconductor layer and in the second semiconductor layer; a plurality of substantially parallel gate structures disposed orthogonal to the plurality of fins; spacers formed on sidewalls of the plurality of gate structures, the spacers comprised of third electrically insulating material; and a layer of the third electrically insulating material disposed only in the first portion of the structure between the first electrically insulating layer and the second electrically insulating layer.

BRIEF DESCRIPTION OF THE SEVERAL VIEWS OF THE DRAWINGS

FIG. 1 shows a wafer bonding operation;

FIG. 2 shows a result of a selective removal of a portion of a Group III-V layer and a dielectric layer in what will be a PFET area;

FIG. 3 shows a result of the growth of additional SiGe material to form a thicker, merged SiGe layer in the PFET area;

FIGS. 4 and 4A show a top view and a cross-sectional view, respectively, of the structure after fins are defined;

FIGS. 5, 5A, 5B and 5C show a top view and three cross-sectional views of the structure after gates are defined orthogonally to the fins, where the view of FIG. 5A is taken along the section line 'A' shown in FIG. 5, the view of FIG. 5B is taken along the section line 'B' shown in FIG. 5, and the view of FIG. 5C is taken along the section line 'C' shown in FIG. 5;

FIGS. 6, 6A, 6B and 6C show a top view and three cross-sectional views of the structure after the SiGe layer in an NFET area is removed, thereby also forming a void 30 in the NFET area between a BOX layer and an overlying dielectric layer, where the view of FIG. 6A is taken along the section line 'A' shown in FIG. 6, the view of FIG. 6B is taken along the section line 'B' shown in FIG. 6, and the view of FIG. 6C is taken along the section line 'C' shown in FIG. 6; and FIGS. 7, 7A, 7B and 7C show a top view and three cross-sectional views of the structure after the formation of dielectric spacers on the gates, thereby also filling the void with the dielectric spacer material to form an insulating dielectric layer that is interposed between the BOX layer and the overlying dielectric layer, where the view of FIG. 7A is taken along the section line 'A' shown in FIG. 7, the view of FIG. 7B is taken along the section line 'B' shown in FIG. 7, and the view of FIG. 7C is taken along the section line 'C' shown in FIG. 7.

DETAILED DESCRIPTION

Reference is made to FIGS. 1-7 for showing an embodiment of this invention. FIGS. 1-7 generally show enlarged cross-section and top views of structures that can be considered as initial and intermediate structures formed during the fabrication of transistor devices such as FINFETs. In FIGS. 1-7 the various layer thicknesses and other dimensions may not be drawn to scale.

Figure 1:
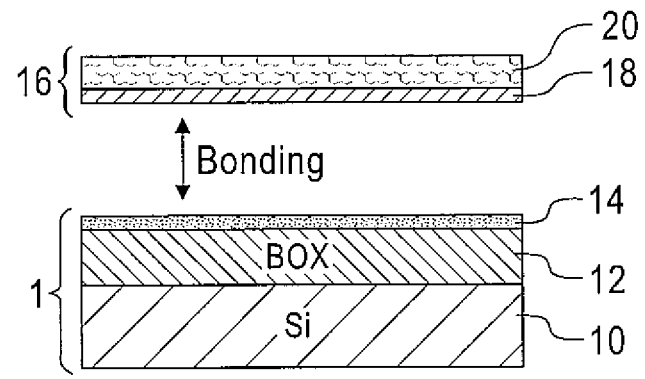
FIGS. 1-7 illustrate process steps in accordance with an embodiment of this invention, where

FIG. 1 shows a wafer bonding operation. An initial structure 1 includes a substrate 10, such as a (bulk) Si substrate, having an overlying dielectric layer (e.g., $SiO_2$) that can be referred to as a buried oxide (BOX) layer 12. The thicknesses of the Si substrate 10 and the BOX layer 12 can be any suitable thicknesses. In that the substrate 10 is not an active portion of subsequently fabricated transistor devices it can be composed of any suitable supportive structural material. Over the BOX layer 12 is a thin layer 14 (e.g., less than about 3 nm) of a semiconductor that can be, for example, Si, Ge, or SiGe (more specifically, $Si_xGe_{1-x}$ where x=0 to 1.). In the ensuing description the semiconductor layer 14 will be assumed to be a SiGe layer although the invention is not limited for use with only SiGe. To a top surface of the SiGe layer 14 is bonded a second structure 16 comprised of a thin (e.g., less than about 3 nm) dielectric layer 18, such as a layer of $Al_2O_3$, $SiO_2$ or SiN, and an overlying layer 20 of a selected Group III-V material such as a layer of GaAs, GaSb, InGaAs, or InGaSb. In other embodiments a quaternary Group III-V material could be used. The Group III-V layer 20 could have a thickness in a range of, for example, about 10 nm to about 50 nm. In some embodiments of interest the Group III-V layer 20 could have a thickness of about 30 nm.

Wafer bonding is a well-known technique and can be achieved, for example, by placing the two structures to be bonded in contact and then applying pressure and heat to join the two structures along their respective contact surfaces.

Figure 2:
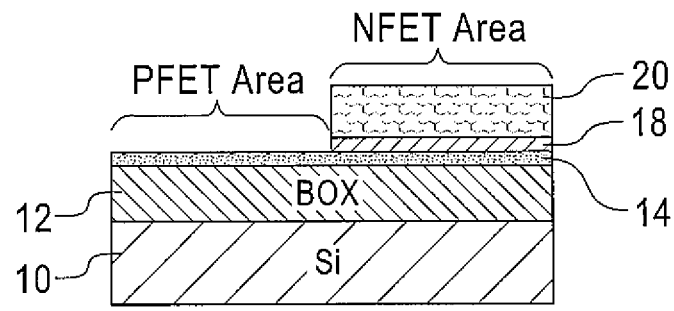

FIG. 2 shows a result of the selective removal of a portion of the Group III-V layer 20 and the dielectric layer 18, e.g., the layer of $Al_2O_3$, in what will be a PFET area. The selective removal exposes the upper surface of the SiGe layer 14. The remaining portion of the Group III-V layer 20 and the underlying dielectric layer 18 define what will be an NFET area. This is desirable for the NFET area at least due to the high electron mobility of the Group III-V material as compared to SiGe material.

Figure 3:
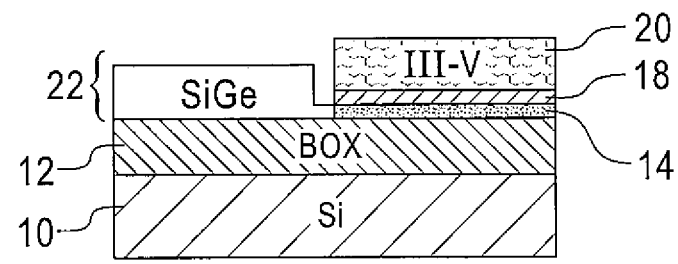

The exposed portion of the SiGe layer 14 may be considered to be a seed layer upon which is grown, as shown in FIG. 3, additional SiGe material to form a thicker, merged SiGe layer 22 in the PFET area. The SiGe material is desirable for the PFET area due its characteristic high hole mobility (as compared to most Group III-V materials). Other materials that exhibit a relatively high hole mobility include, for example, GaSb and InGaSb. The SiGe layer 22 can have a total thickness of, for example, of about 10 nm to about 15 nm. The SiGe layer 22 can be grown using any conventional and suitable epitaxial growth process. For example the SiGe layer 22 can be formed by the epitaxial growth of SiGe using a mixture of silane, dichlorosilane and germane gases by a chemical vapor deposition (CVD) process, such as a (high vacuum) CVD process with $Si_2H_6$ and $GeH_4$ gas species. The NFET area is preferably masked prior to the growth of the SiGe layer 22.

In embodiments where the layer 14 is instead composed of Si or Ge then a thicker Si or Ge layer can be epitaxially grown using any suitable growth process and chemistry.

At this point it can be noticed in FIG. 3 that the portion of the initial SiGe layer 14 in the NFET area remains between the dielectric layer 18 and the BOX layer 12. The presence of this portion of the initial thin semiconductor (e.g., SiGe) layer 14 (shown with cross-hatching) is undesirable in that it can form a short circuit to a subsequently fabricated NFET. Also, the presence of this portion of the initial thin semiconductor (e.g., SiGe) layer 14 can increase a parasitic capacitance that will be associated with the subsequently fabricated NFET.

As will be described below an aspect of this invention is a procedure that removes all or at least a portion of the initial SiGe layer 14 in the NFET area.

Figure 4:
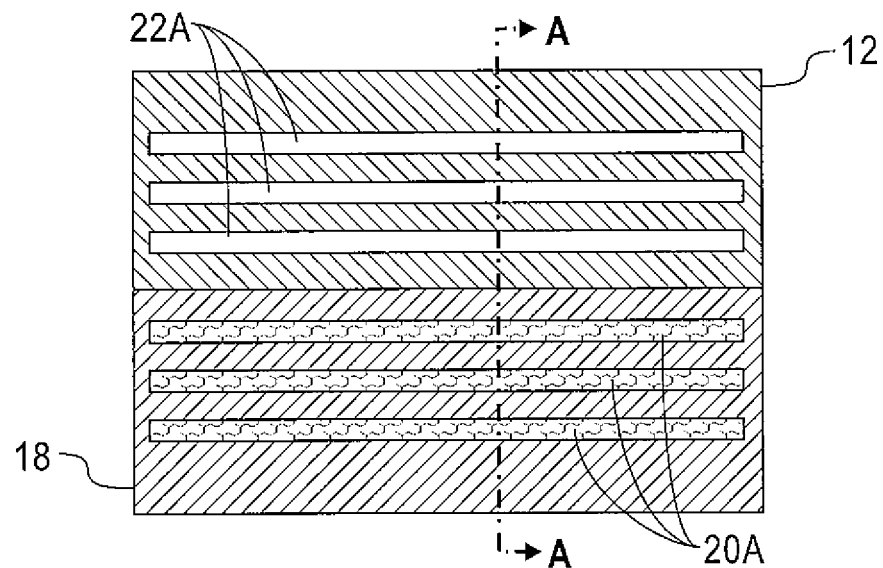
Figure 4A:
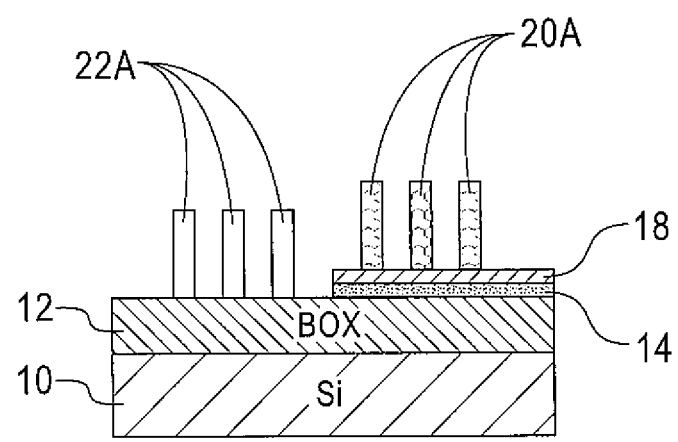

Continuing now with description of this invention, FIGS. 4 and 4A show a top view and a cross-sectional view, respectively, of the structure after fins are defined. The view of FIG. 4A is taken along the section line 'A' shown in FIG. 4. In this example there are two sets of fins, the first set includes fins 20A formed in the Group III-V layer 20 and the second set includes fins 22A formed in the SiGe layer 22. The fins 20A and 22A can each have a height that corresponds to the thickness of the respective layer from which they are formed or, in this example, about 30 nm and about 10-15 nm, respectively. The fin widths can be in a range of, by example, about 5 nm to about 10 nm and they can have any desired length. Although each set of fins 20A and 22A is shown to include three members more or less than three fins can be formed in each set. Fin formation can use any conventional technique, such as selectively masking and etching (e.g., a reactive ion etch (RIE)) with a chemistry selective to the material from which the fins are formed.

Note in FIG. 4A that the portion of the initial SiGe layer 14 in the NFET area still remains between the dielectric layer 18 and the BOX layer 12.

Figure 5:
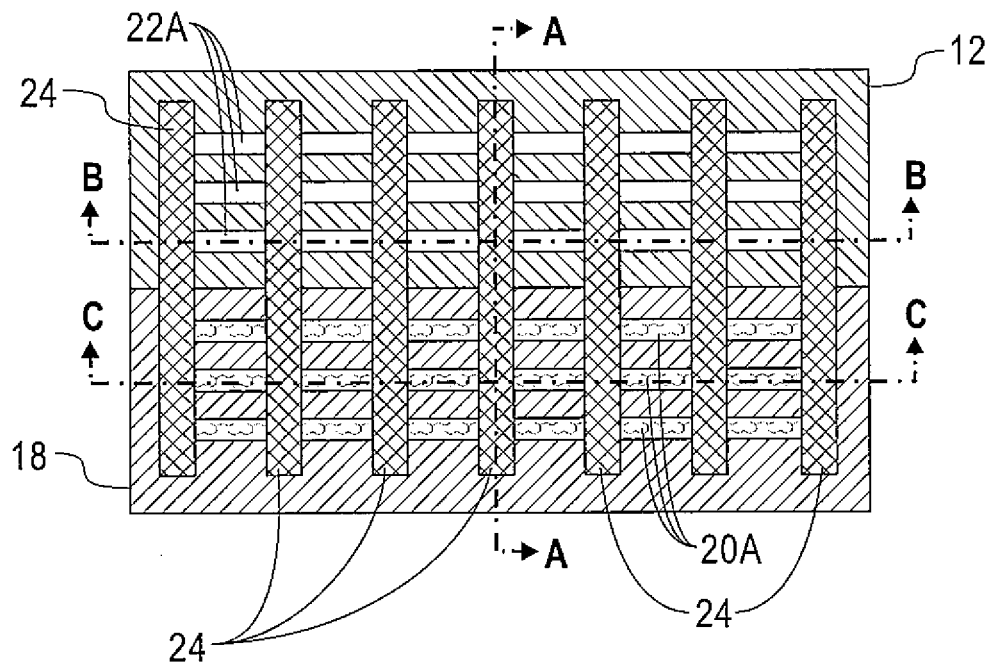
Figure 5A:
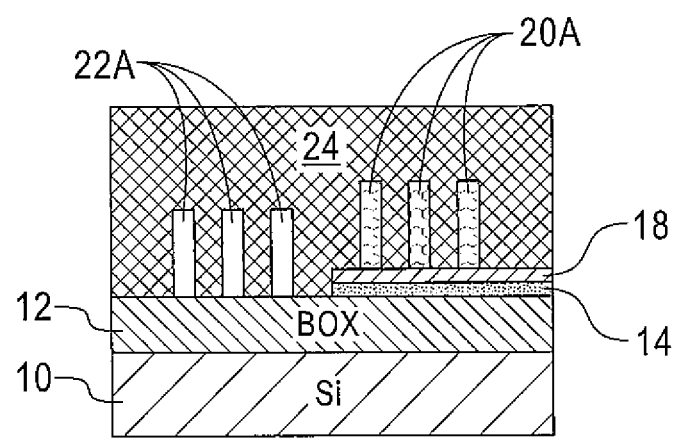
Figure 5B:
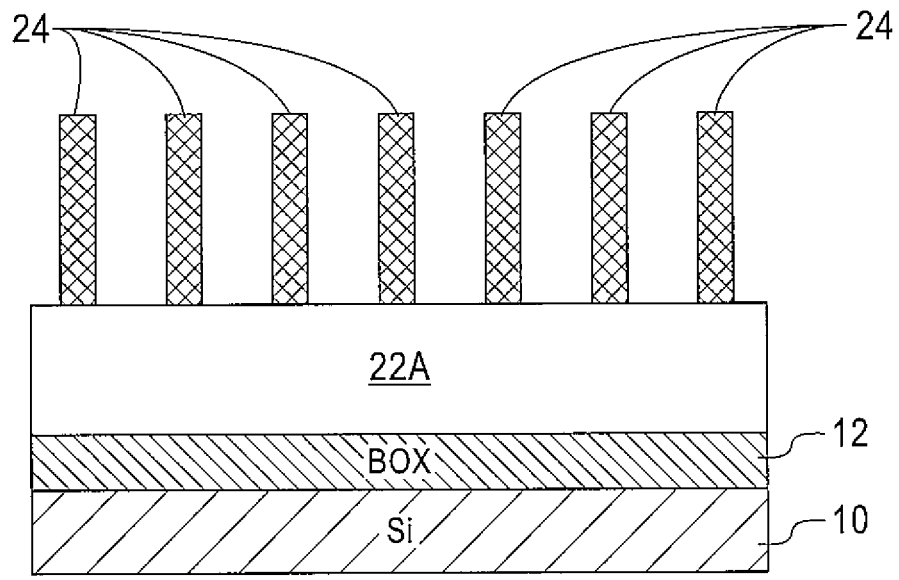
Figure 5C:
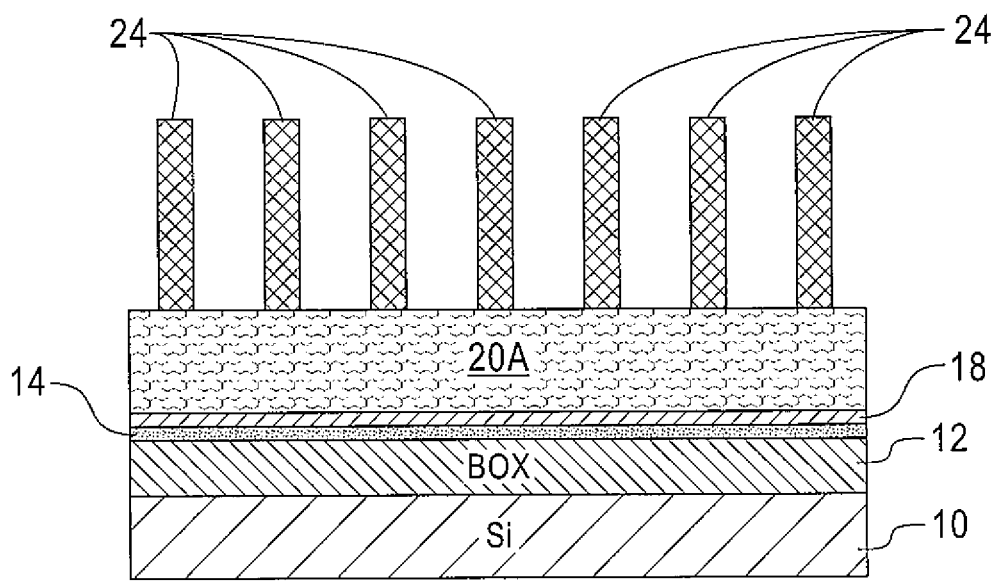

FIGS. 5, 5A, 5B and 5C show a top view and three cross-sectional views of the structure after gates 24 are defined orthogonally to the fins 20A and 20B. The view of FIG. 5A is taken along the section line 'A' shown in FIG. 5 (through a gate 24), the view of FIG. 5B is taken along the section line 'B' shown in FIG. 5 (through a fin 22A), and the view of FIG. 5C is taken along the section line 'C' shown in FIG. 5 (through a fin 20A). The gates 24 can be 'final' metal gates or they can be gate electrode placeholder or gate precursors or 'dummy' gates that are subsequently removed during a replacement gate process. Where a gate 24 intersects a fin 20A or 22A it covers the fin on the top and opposing side surfaces as shown in FIG. 5A.

When the gates 24 are placeholder or precursor or 'dummy' gates they can be subsequently removed by a dry etch or wet etch process. In one embodiment the gate electrode precursor can be comprised of polycrystalline silicon or amorphous silicon and can be removed for example with a dry etch process comprising $SF_6$. In another embodiment the gate electrode precursor can be comprised of polycrystalline silicon or amorphous silicon and can be removed, for example, with a wet etch process comprising aqueous $NH_4OH$ or tetramethylammonium hydroxide. In an embodiment the gate electrode precursor can be comprised of silicon dioxide and can be removed, by example, with a wet etch comprising aqueous hydrofluoric acid, ammonium fluoride or both. In one embodiment the gate electrode precursor can be comprised of silicon nitride and can be removed, for example, with a wet etch comprising aqueous phosphoric acid.

When the gates 24 are 'final', metal gates they could be formed by gate dielectric deposition followed by gate metal deposition. For example, the gate dielectric can be formed as a layer of high dielectric constant (high-k) material comprising a dielectric metal oxide and having a dielectric constant that is greater than the dielectric constant of silicon nitride of 7.5. The high-k dielectric layer may be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k dielectric layer may be from 1 nm to 10 nm, and more preferably from about 1.5 nm to about 3 nm. The high-k dielectric layer can have an effective oxide thickness (EOT) on the order of, or less than, about 1 nm. The gate metal can be deposited directly on the top surface of the high-k dielectric layer by, for example, chemical vapor deposition (CVD), physical vapor deposition (PVD), or atomic layer deposition (ALD). As non-limiting examples the gate metal can include a metal system selected from one or more of TiN, TiC, TaN, TaC, TaSiN, HfN, W, Al and Ru, and may be selected at least in part based on the desired work function (WF) of the device (NFET or PFET).

Note in FIGS. 5A and 5C that the portion of the initial SiGe layer 14 in the NFET area still remains between the dielectric layer 18 and the BOX layer 12.

Figure 6:
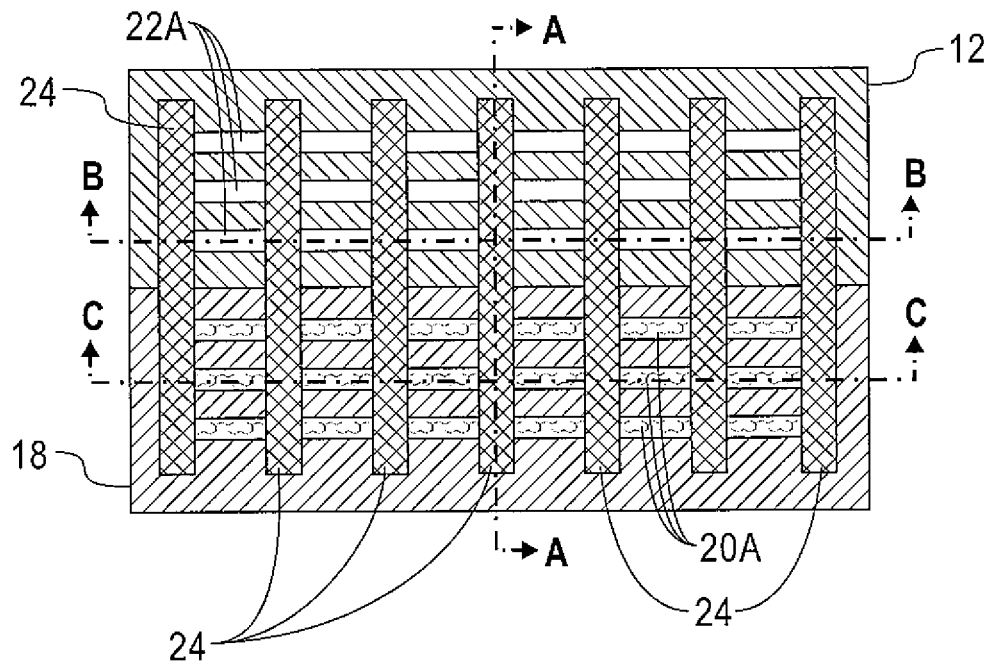
Figure 6A:
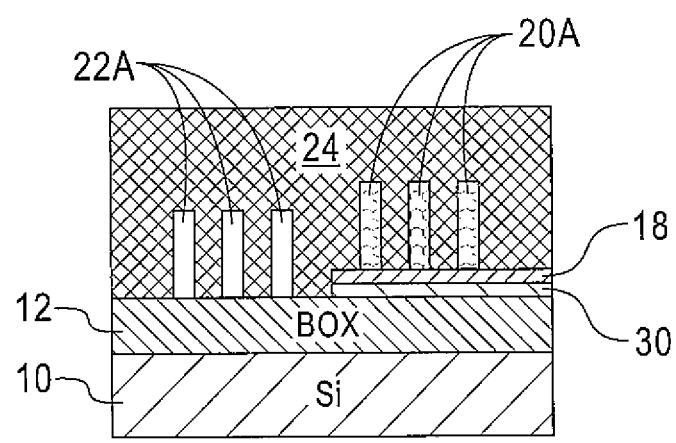
Figure 6B:
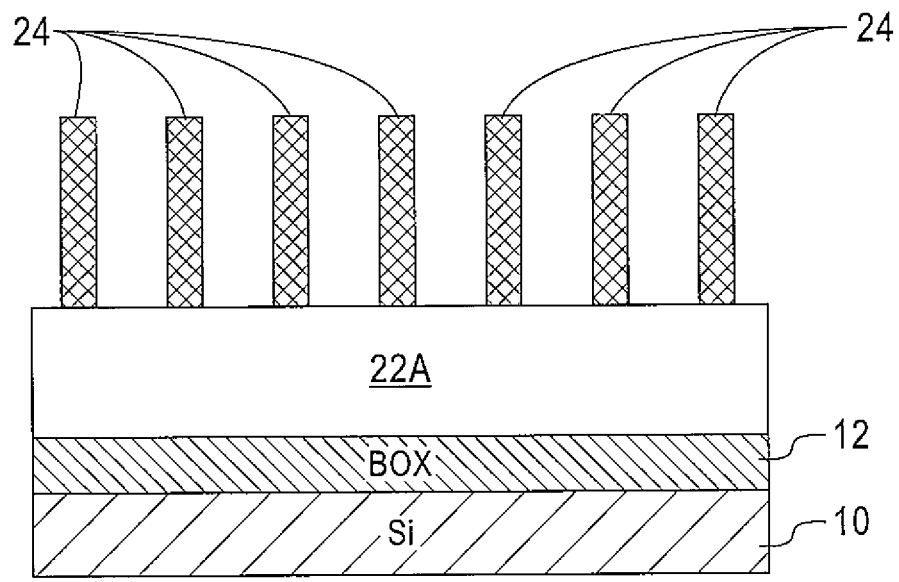
Figure 6C:
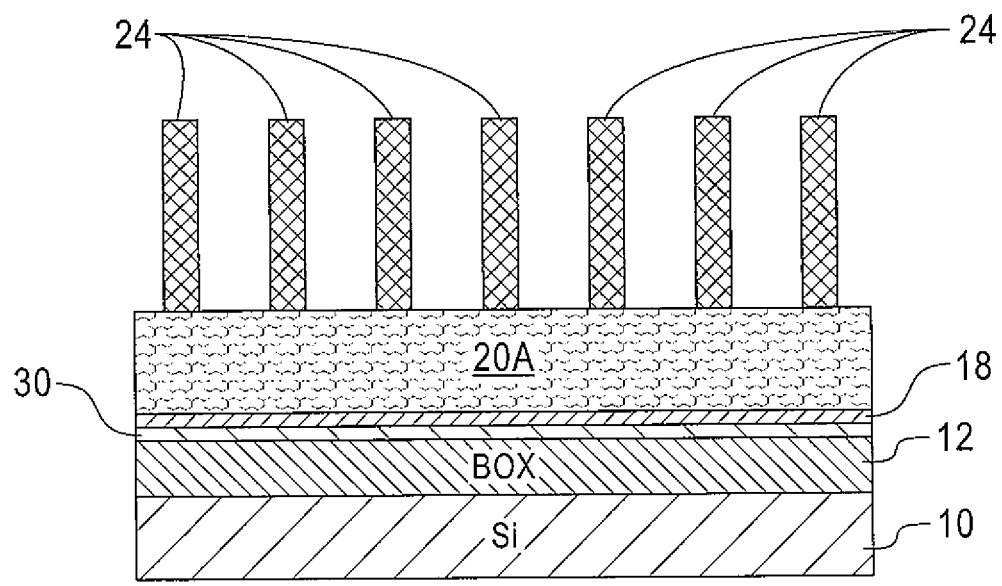

In accordance with an aspect of this invention FIGS. 6, 6A, 6B and 6C show a top view and three cross-sectional views of the structure after the SiGe layer 14 in the NFET area is removed. The view of FIG. 6A is taken along the section line 'A' shown in FIG. 6 (through a gate 24), the view of FIG. 6B is taken along the section line 'B' shown in FIG. 6 (through a fin 22A), and the view of FIG. 6C is taken along the section line 'C' shown in FIG. 6 (through a fin 20A). The resulting intermediate structure thus has a void 30 in the NFET area between the BOX layer 12 and the overlying dielectric layer 18.

In this embodiment the PFET area is masked, e.g., with resist, and the SiGe layer 14 is entirely or almost entirely removed using an etching process that is selective to only the SiGe layer 14. Suitable etchants for SiGe include, but are not limited to, $NH_4OH$, $H_2O_2$, HCl and HBr. If the layer 14 is comprised of, e.g., Ge then one suitable and non-limiting etching process uses $XeF_2$ that is performed at about room temperature for a period of about 1 second to about 5 minutes.

Figure 7:
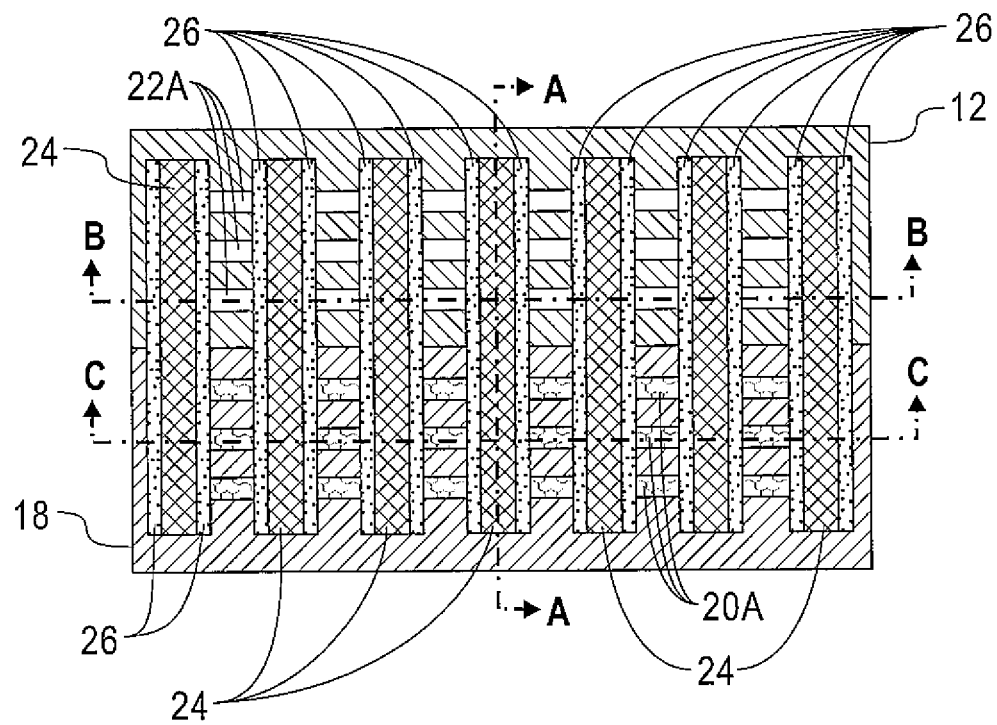
Figure 7A:
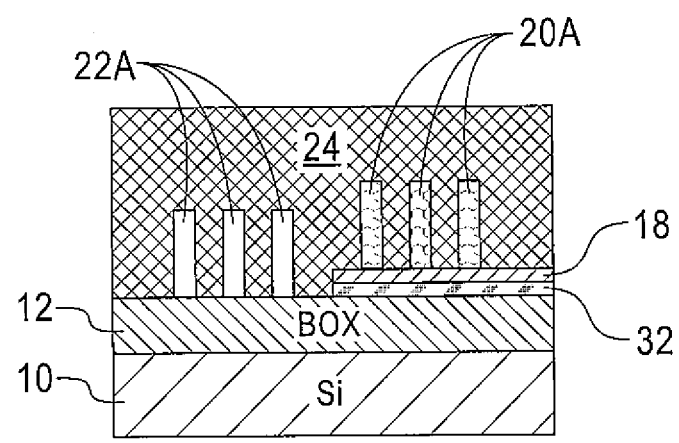
Figure 7B:
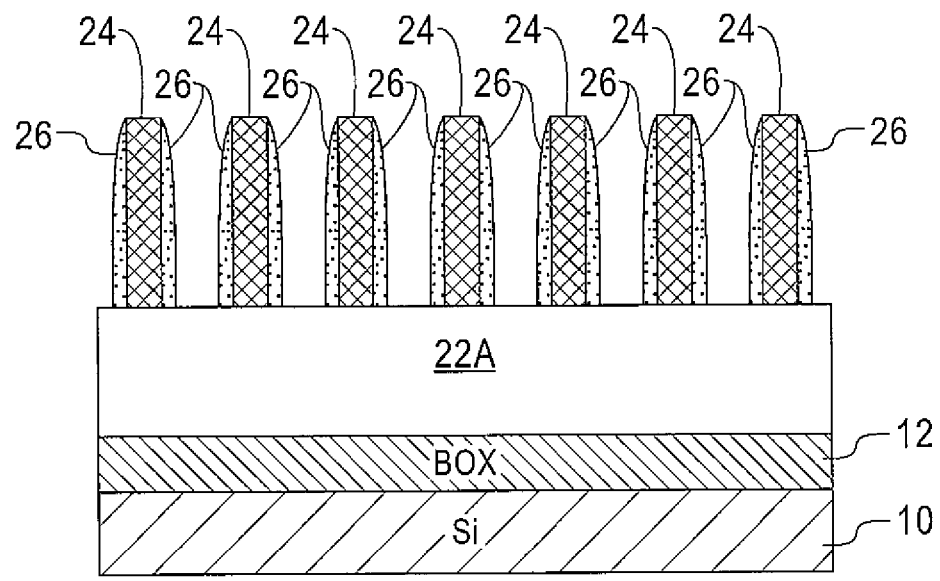
Figure 7C:
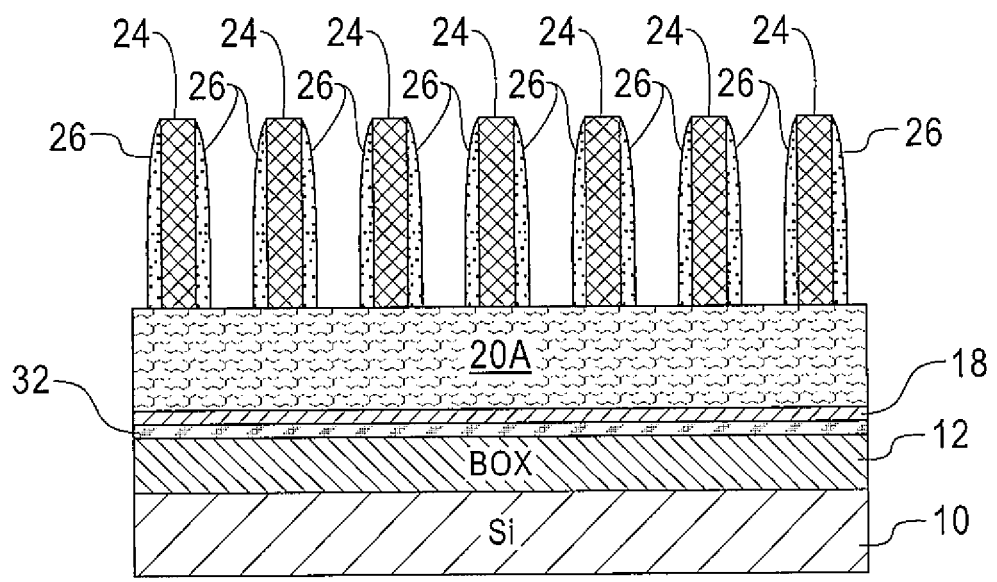

FIGS. 7, 7A, 7B and 7C show a top view and three cross-sectional views of the structure after the formation of dielectric spacers 26 on the gates (gate structures) 24. As before, the view of FIG. 7A is taken along the section line 'A' shown in FIG. 7, the view of FIG. 7B is taken along the section line 'B' shown in FIG. 7, and the view of FIG. 7C is taken along the section line 'C' shown in FIG. 7. The spacers 26 can be formed by, for example, a conformal deposition process such as the chemical vapor deposition (CVD) or the molecular layer deposition (MLD) of silicon oxide or more preferably silicon nitride on the gates 24. The spacers 26 are formed generally along the sidewalls of the gate structures 24. Further in accordance with an aspect of this invention the conformal deposition of the dielectric spacer material also results in the void 30 being filled with the selected spacer material so as to form an insulating dielectric layer 32 (as opposed to the semiconductor layer 14) that is interposed between the BOX layer 12 and the overlying dielectric layer 18.

The formation of the insulating dielectric layer 32 beneficially reduces the probability of an electrical short circuit forming beneath the NFET while also reducing parasitic capacitance that may be associated with the NFET.

Processing can then continue in a conventional fashion, for example, by growing epitaxial extension/source/drains on the NFET and the PFET and depositing a contact inter-layer dielectric (ILD) layer followed by planarization. For the replacement gate process the precursor or dummy gate structures are first replaced with metal gates over a high-k dielectric layer (as was mentioned above). Apertures are opened in the ILD layer and suitable contact metallization is then applied to the source, drain and the gate (stack/structure) of each of the FINFETs thus formed.

Figure 8:
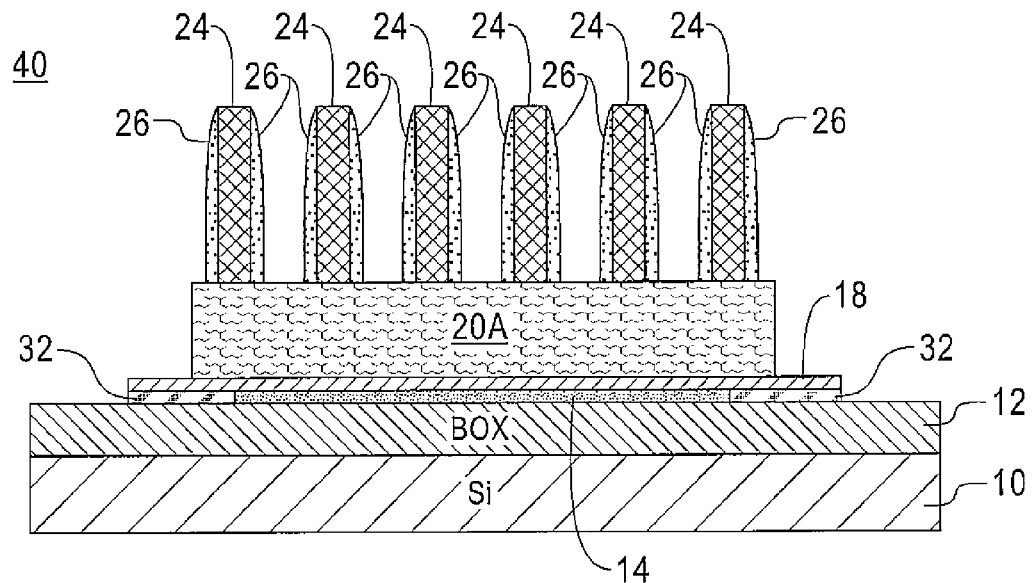
FIGS. 8, 9 and 10 each are a cross-sectional view taken though a fin in the NFET area and illustrate different alternative embodiments of this invention.
Figure 9:
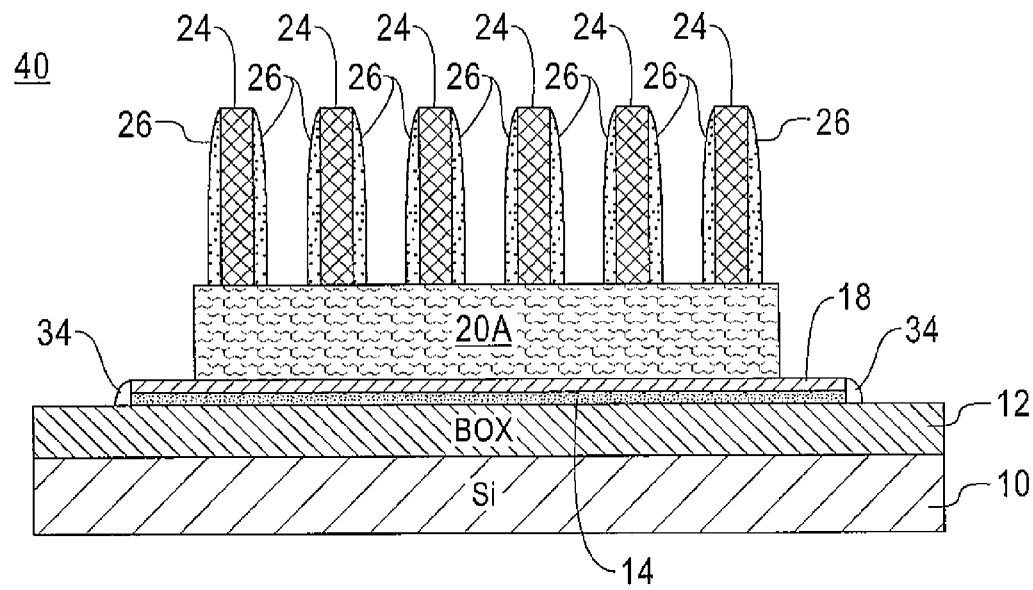
Figure 10:
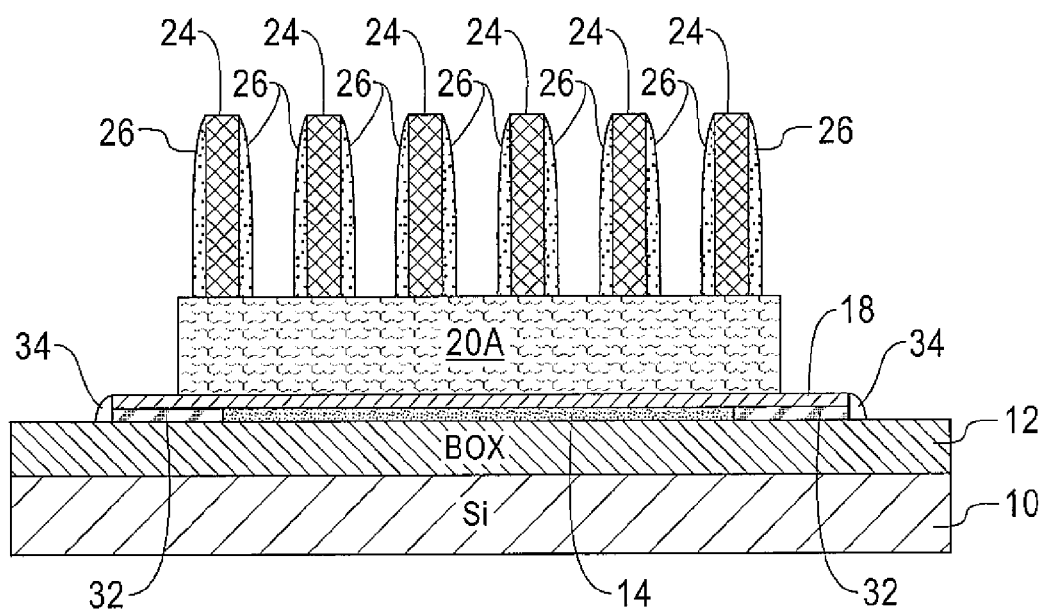

FIGS. 8, 9 and 10 are each a cross-sectional view taken through the NFET area (corresponding to the views of FIG. 7C), where each of these figures represents an alternative embodiment. These FIGURES show more clearly an active island or mesa 40 disposed on the BOX layer 12 containing the fins, gates and related structures discussed above.

The embodiment of FIG. 8 shows that the SiGe layer 14 is only partially removed from between the BOX layer 12 and the overlying dielectric layer 18. The removal occurs at the edges of the island 40 and the lateral extent of the removed material (void) can be controlled by controlling the duration of the etch time (reducing the etch time). In this embodiment the step of depositing the spacers 26 also then conformally fills the voids formed at edges of the active island 40 while the remaining material of the SiGe layer 14 remains in place.

This embodiment (as well as the embodiments of FIGS. 9 and 10) can be useful since typically the likelihood is greater that a short circuit will develop in the SiGe layer 14 at or near the edges of the active island or mesa 40.

The embodiment of FIG. 9 illustrates that the SiGe layer 14 is not removed from between the between the BOX layer 12 and the overlying dielectric layer 18. In this embodiment the step of depositing the spacers 26, or a separate spacer deposition step, forms spacers 34 at the edges of the active island 40 thereby reducing the likelihood of a short circuit developing at the edges of the active island or mesa 40.

The embodiment of FIG. 10 illustrates a hybrid approach to the embodiments of FIGS. 8 and 9, where the SiGe layer 14 is only partially removed from between the BOX layer 12 and the overlying dielectric layer 18, where the resulting void at the edges of the active island 40 is filled with the spacer material 32, and where the spacers 34 of FIG. 9 are grown at the edges of the active island 40.

It is to be understood that the exemplary embodiments discussed above with reference to FIGS. 1-10 can be used on common variants of FET devices including, e.g., FET devices with multi-fingered FIN and/or gate structures as well as FET devices of varying gate width and length.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and etching processes, may be used by those skilled in the art. Further, the exemplary embodiments are not intended to be limited to only those semiconductor materials, metals, insulators, layer thicknesses and the like that were specifically disclosed above. Any and all such and similar modifications of the teachings of this invention will still fall within the scope of this invention.

What is claimed is:

1. A method, comprising:
    providing a structure comprised of a substrate, a first electrically insulating layer overlying a surface of the substrate, a first semiconductor layer comprised of a first semiconductor material overlying the first electrically insulating layer, a second electrically insulating layer overlying the first semiconductor layer in a first portion of the structure, and a second semiconductor layer comprised of a second semiconductor material different from the first semiconductor material overlying the second electrically insulating layer in the first portion;
    growing additional first semiconductor material on the first semiconductor layer in a second portion of the structure to form a regrown semiconductor layer;
    forming fins in the regrown semiconductor layer and in the second semiconductor layer;
    forming gate structures orthogonal to the fins;
    removing at least a portion of the first semiconductor layer in the first portion of the structure between the first electrically insulating layer and the second electrically insulating layer to form a void, where the step of removing is performed subsequent to the step of forming the gate structures; and
    filling the void with an electrically insulating material.

2. The method of claim 1, where providing the structure comprises bonding a first structure comprised of the substrate, the first electrically insulating layer and the first semiconductor layer to a second structure comprising the second electrically insulating layer and the second semiconductor layer.

3. The method of claim 2, where providing the structure further comprises removing the second electrically insulating layer and the second semiconductor layer in the second portion to expose the first semiconductor layer.

4. The method of claim 1, where forming gate structures comprises forming metal gate structures.

5. The method of claim 1, where forming gate structures comprises forming precursor gate structures.

6. The method of claim 1, where removing at least a portion of the first semiconductor layer removes substantially all of the first semiconductor material.

7. The method of claim 1, further comprising forming a spacer around edges of an active island to cover edges of the electrically insulating material that fills the void.

8. The method of claim 1, where the first semiconductor material is comprised of $Si_xGe_{1-x}$ where x=0 to 1, and where the second semiconductor material is comprised of a Group III-V semiconductor material.

9. The method of claim 1, where the first semiconductor material is one selected to exhibit a higher mobility for holes relative to the second semiconductor material, where the second semiconductor material is one selected to exhibit a higher mobility for electrons relative to the first semiconductor material, and where the first portion is a portion in which an NFET is to be formed, and where the second portion is a portion of the structure in which a PFET is to be formed.

10. A method, comprising:
    providing a structure comprised of a substrate, a first electrically insulating layer overlying a surface of the substrate, a first semiconductor layer comprised of a first semiconductor material overlying the first electrically insulating layer, a second electrically insulating layer overlying the first semiconductor layer in a first portion of the structure, and a second semiconductor layer comprised of a second semiconductor material different from the first semiconductor material overlying the second electrically insulating layer in the first portion;
    growing additional first semiconductor material on the first semiconductor layer in a second portion of the structure to form a regrown semiconductor layer;
    forming fins in the regrown semiconductor layer and in the second semiconductor layer;
    forming gate structures orthogonal to the fins;
    removing at least a portion of the first semiconductor layer in the first portion of the structure between the first electrically insulating layer and the second electrically insulating layer to form a void; and
    filling the void with an electrically insulating material;
    where removing at least a portion of the first semiconductor layer removes the first semiconductor material around edges of an active island to form the void under edges of the active island, and where filling the void with an electrically insulating material fills the void around the edges of the active island.

11. The method of claim 10, further comprising forming a spacer around the edges of the active island to cover edges of the electrically insulating material that fills the void.

12. A method, comprising:
    providing a structure comprised of a substrate, a first electrically insulating layer overlying a surface of the substrate, a first semiconductor layer comprised of a first semiconductor material overlying the first electrically insulating layer, a second electrically insulating layer overlying the first semiconductor layer in a first portion of the structure, and a second semiconductor layer comprised of a second semiconductor material different from the first semiconductor material overlying the second electrically insulating layer in the first portion;

growing additional first semiconductor material on the first semiconductor layer in a second portion of the structure to form a regrown semiconductor layer;

forming fins in the regrown semiconductor layer and in the second semiconductor layer;

forming gate structures orthogonal to the fins;

removing at least a portion of the first semiconductor layer in the first portion of the structure between the first electrically insulating layer and the second electrically insulating layer to form a void; and filling the void with an electrically insulating material;

where the step of filling the void is performed simultaneously with depositing spacers on sidewalls of the gate structures, where the spacers are comprised of the electrically insulating material.

* * * * *